US005914645A

United States Patent [19]
Kobayashi et al.

[11] Patent Number: 5,914,645
[45] Date of Patent: Jun. 22, 1999

[54] SURFACE ACOUSTIC WAVE DEVICE WITH OPTIMIZED RATIO OF FILM THICKNESS TO ELECTRODE PERIOD

[75] Inventors: Yasumi Kobayashi, Yawata; Kuniyuki Matsui, Hirakata; Naoki Tanaka, Sakai; Hiroshi Okano, Neyagawa; Tatsuro Usuki, Osaka; Kenichi Shibata, Hashimoto, all of Japan

[73] Assignee: Sanyo Electric Co., Ltd., Moriguchi, Japan

[21] Appl. No.: 08/868,893

[22] Filed: Jun. 4, 1997

[30] Foreign Application Priority Data

Jun. 5, 1996 [JP] Japan .................................. 8-142726

[51] Int. Cl.$^6$ ............................ H03H 9/64; H03H 9/145
[52] U.S. Cl. .................. 333/193; 310/313 A; 310/313 B
[58] Field of Search .................................. 333/193–196; 310/313 R, 313 A, 313 B, 313 C, 313 D

[56] References Cited

U.S. PATENT DOCUMENTS

| | | | |
|---|---|---|---|
| 5,434,465 | 7/1995 | Sato et al. | 310/313 A |
| 5,719,536 | 2/1998 | Matsui et al. | 333/193 |
| 5,719,537 | 2/1998 | Matsui et al. | 333/193 |
| 5,760,522 | 6/1998 | Kobayashi et al. | 310/313 A |

FOREIGN PATENT DOCUMENTS 6-112763  4/1994  Japan .
8-288788  11/1996  Japan .

OTHER PUBLICATIONS

Tonami et al., "On the Leaky Acoustic Surface Waves Propagating on LiTaO$_3$ and LiNbO$_3$ Substrates"; *Proceedings of the 15th Symposium on Fundamentals and Applications of Ultrasonic Electronics*, pp. 185–186 (1994).

Kanda et al., "Temperature Characteristics of Love–Type SAW Resonators on SiO$_2$/Au/Y–x LiTaO$_3$ Structure", *Proceedings of the 1994 IEICE (Institute of Electronics, Information and Communication Engineers) Spring Conference*, "A–437", pp. 1–440.

Kanada et al., "Experiment of Love–Type SAW Resonators Utilizing Au/Y–X LiTaO$_3$"; *Proceedings of the 1994 IEICE (Institute of Electronics, Information and Communication Engineers) Spring Conference*, "A–438", pp. 1–441.

Japanese Journal of Applied Physics, vol. 29, (1990) Supplement 29–1, pp. 119–121, "Characteristic of Leaky Surface Waves Propagating on Li$_2$B$_4$O$_7$ Substrate with a Thin Aluminum Plate," by Masao Murota and Yasutaka Shimizu.

Japanese Journal of Applied Physics, vol. 30, (1991) Supplement 30–1, pp. 143–145, "Effects of aluminum Thickness on the Temperature Characteristics of Leaky Surface Wave Filters on LST–cut Quartz Substrate," by Masao Murota, Tetsuya Hirano, C.S. Lam, D.E. Holt and Yasutaka Shimizu.

*Primary Examiner*—Robert Pascal
*Assistant Examiner*—Barbara Summons
*Attorney, Agent, or Firm*—Armstrong, Westerman, Hattori, McLeland & Naughton

[57] ABSTRACT

In a surface acoustic wave device comprising a substrate of lithium tantalate or lithium niobate, and interdigital electrodes formed on the substrate and made of a thin film consisting primarily of aluminum, the interdigital electrodes are optimized in the ratio of the thickness of the film to the period of a plurality of electrode digits connected to a common terminal with propagation loss taken as an objective function. The ratio is set in the range of 0.03 to 0.10 to ensure a lower propagation loss than in the prior art.

4 Claims, 6 Drawing Sheets

SURFACE ACOUSTIC WAVE DEVICE WITH OPTIMIZED RATIO OF FILM THICKNESS TO ELECTRODE PERIOD

FIELD OF THE INVENTION

The present invention relates to surface acoustic wave devices comprising a substrate adapted to excite surface acoustic waves wherein the longitudinal wave component predominates over the transverse wave component, or quasi surface acoustic waves wherein the longitudinal wave component predominates over the transverse wave component, or surface skimming bulk waves wherein the longitudinal wave component predominates over the transverse wave component.

BACKGROUND OF THE INVENTION

In recent years, surface acoustic wave devices have found wide application in communications devices such as motor vehicle telephones as circuit elements of resonator filters, signal processing delay lines, etc. For example, FIG. 5 shows a surface acoustic wave device comprising interdigital electrodes 2, 3 and lattice like reflectors (not shown) which are formed on the surface of a piezoelectric substrate 1. The device converts electric signals to surface acoustic waves and vice versa.

Surface acoustic waves are surface waves which literally propagate along the surface of an elastic body, and the energy thereof is not radiated into the substrate. A plurality of modes of excitation have been discovered as such surface acoustic waves. For example, already known are the Rayleigh wave, Sezawa wave, Love wave, electroacoustic wave, etc.

In the Rayleigh and Sezawa waves, predominant are both a longitudinal wave component having a displacement in the same direction as the direction of propagation and a transverse wave component having a displacement depthwise of the substrate. On the other hand, predominant in the Love wave and electroacoustic wave is a transverse component having a displacement in parallel to the substrate surface and perpendicular to the propagation direction. While three kinds of bulk waves, i.e., "slow transverse wave," "rapid transverse wave" and "longitudinal wave" are usually present in the piezoelectric substrate, the surface acoustic waves propagate at a phase velocity lower than that of the "slow transverse wave."

Also known are elastic waves which propagate along the surface of an elastic body while radiating energy depthwise of the body. These waves are called quasi surface acoustic waves or leaky surface acoustic waves. The quasi surface acoustic wave initially discovered comprises a predominant transverse wave component having a displacement in parallel to the substrate surface and perpendicular to the propagation direction, and is intermediate between the "slow transverse wave" and the "rapid transverse wave" in phases velocity.

Quasi surface acoustic waves having a predominant longitudinal wave component are discovered in recent years one after another (see JP-A-112763/1994 and Proceedings of the 15th Symposium on Fundamentals and Applications of Ultrasonic Electronics, 1994, pp. 185–186). These quasi surface acoustic waves having a predominant longitudinal wave component are intermediate between the "rapid transverse wave" and the "longitudinal wave."

On the other hand, there is a case wherein bulk waves propagating along and close to the surface of a substrate are excited by interdigital electrodes and detected by other interdigital electrodes on the same substrate. Such bulk waves are termed surface skimming bulk waves. It is thought that there are three kinds of surface skimming bulk waves in corresponding relation with the usual bulk waves. However, mainly handled at present is the surface skimming bulk wave which comprises a predominant transverse wave component having a displacement in parallel to the substrate surface and perpendicular to the propagation direction.

The characteristics of elastic waves include acoustic velocity, propagation loss and electromechanical coupling factor. These characteristics relate directly to the design parameters of the circuit to which the surface acoustic wave device is applied.

The period T of the electrode digits of interdigital electrodes or lattice like reflectors has a value equivalent to the wavelength of elastic waves, so that at a constant frequency, the lower the acoustic velocity, the smaller is the wavelength and the more difficult are the electrodes to fabricate. It is therefore desired that the acoustic velocity be higher.

The resonance sharpness of surface acoustic wave resonators and the insertion loss of surface acoustic wave filters are dependent directly on the propagation loss of surface acoustic waves. For this reason, the propagation loss should preferably be small.

On the other hand, the electromechanical coupling factor represents the ratio of conversion of the energy of an input electric signal into the energy of surface acoustic waves. When the interdigital electrodes have a sufficiently increased number of electrode digits, elastic waves of desired energy can be excited even if the electromechanical coupling factor is small, whereas the interdigital electrodes then have an increased electrical capacity, which presents difficulty in impedance matching with an external circuit, necessitating an additional matching circuit for impedance matching. Further it is known that the number of electrode digits of interdigital electrodes is approximately in inverse proportion to the operating frequency range of the surface acoustic wave device, such that an increase in the number of electrode digits limits the realizable characteristics to a narrow frequency range. Accordingly, the electromechanical coupling factor is preferably great.

Already known are substrate conditions (e.g., the relationship between the crystal axis and the direction of propagation of surface acoustic waves) and electrode conditions (e.g., the period of electrode digits and film thickness of the electrode digits) for improving the foregoing characteristics in connection with elastic waves (such as the Rayleigh wave and Sezawa wave) which comprise two predominant components, i.e., a transverse wave component having a depthwise displacement and a longitudinal wave component, and elastic waves (such as the electroacoustic wave, Love wave, quasi surface acoustic wave of the transverse wave type and surface skimming bulk wave of the transverse wave type) which comprise a predominant transverse wave component having a displacement in parallel to the surface and perpendicular to the propagation direction [Proceedings of the 1994 IEICE (Institute of Electronics, Information and Communication Engineers) Spring Conference, "A-437," "A-438," Japanese Journal of Applied Physics, vol. 29(1990) Supplement 29-1, pp. 119–121, Japanese Journal of Applied Physics, vol. 30(1991) Supplement 30-1, pp. 143–145, etc.].

However, the requirements of the electrodes for improving the above characteristics still remain to be clarified for surface acoustic waves wherein the longitudinal wave component predominates over the transverse wave component (longitudinal wave-type surface acoustic waves), quasi surface acoustic waves wherein the longitudinal wave component predominates over the transverse wave component (longitudinal wave-type quasi surface acoustic waves) and surface skimming bulk waves wherein the longitudinal wave component predominates over the transverse wave component (longitudinal wave-type surface skimming bulk waves).

Especially, longitudinal wave-type quasi surface acoustic waves have an acoustic velocity in excess of 6000 m/s and an electromechanical coupling factor of greater than 2%, and are therefore advantageous to use in surface acoustic wave devices in this respect, whereas conventional surface acoustic wave devices for use with longitudinal wave-type surface acoustic waves are as great as 0.5 dB per wavelength in propagation loss. Such an extremely great loss has been an obstacle to the actual use of the waves of the type mentioned.

SUMMARY OF THE INVENTION

An object of the present invention is to clarify electrode requirements for reducing the propagation loss of surface acoustic wave devices which comprise a substrate adapted to excite longitudinal wave-type surface acoustic waves, longitudinal wave-type quasi surface acoustic waves, or longitudinal wave-type surface skimming bulk waves, and to provide a surface acoustic wave device exhibiting higher performance than conventional devices.

The present invention provides a surface acoustic wave device comprising a substrate capable of exciting surface acoustic waves wherein a longitudinal wave component predominates over a transverse wave component, quasi surface acoustic waves wherein a longitudinal wave component predominates over a transverse wave component, or surface skimming bulk waves wherein a longitudinal wave component predominates over a transverse wave component, and interdigital electrodes made of an electrically conductive thin film and formed on a surface of the substrate. The interdigital electrodes are optimized in the ratio of the thickness of the film to the period of a plurality of electrode digits connected to a common terminal with propagation loss taken as an objective function.

For example, longitudinal wave-type quasi surface acoustic waves have a major portion of the energy thereof concentrated in a depthwise range of several wavelengths from the surface of the substrate. Accordingly, when a thin film is formed on the substrate, the characteristics of the waves are affected by the thin film. Especially, the acoustic velocity is lower in the electrically conductive thin film providing the interdigital electrodes than in the substrate, so that the thin film suppresses the radiation of the energy in the depthwise direction of the substrate to result in a reduced propagation loss.

This effect to suppress the radiation of energy increases with an increase in the thickness of the conductive thin film. When having a thickness not smaller than a specified value, the film no longer permits the radiation of any energy into the substrate, with the result that the longitudinal wave-type quasi surface acoustic waves become longitudinal wave-type surface acoustic waves. However, if the film thickness exceeds the specified value, other surface acoustic waves are excited in the interior of the conductive thin film owing to the film thickness as related with the period of the electrode digits, giving rise to a higher mode and accumulating energy in the interior of the film to result in an increased propagation loss conversely.

Accordingly, it follows that with the propagation loss taken as an objective function, there is an optimum value for the thickness of the conductive thin film owing to the relation of the thickness with the electrode digit period.

With the surface acoustic wave device of the invention, therefore, the propagation loss is reduced to a minimum by optimizing the ratio of the film thickness to the digit period of the interdigital electrodes.

Specifically stated, the substrate is made of lithium tantalate, and the interdigital electrodes are made of an electrically conductive material consisting primarily of aluminum, or an electrically conductive material equivalent to aluminum in specific gravity. With this specific construction, the ratio of the film thickness to the digit period of the interdigital electrodes is set in the range of 0.03 to 0.10, whereby the propagation loss can be made sufficiently lower than conventionally. The ratio is preferably in the range of 0.05 to 0.09, more preferably 0.08 or a value which can be regarded substantially as 0.08, whereby the propagation loss can be minimized.

Stated more specifically, the direction of propagation of the surface acoustic waves wherein the longitudinal wave component predominates over the transverse wave component, the quasi surface acoustic waves wherein the longitudinal wave component predominates over the transverse wave component or the surface skimming bulk waves wherein the longitudinal wave component predominates over the transverse wave component is (40 deg to 90 deg, 40 deg to 90 deg, 0 deg to 60 deg) as expressed in Eulerian angles and within a range equivalent thereto, whereby a higher acoustic velocity and a greater electromechanical coupling factor are available.

With another specific construction, the substrate is made of lithium niobate, and the interdigital electrodes are made of an electrically conductive material consisting primarily of aluminum, or an electrically conductive material equivalent to aluminum in specific gravity. In this construction, the ratio of the film thickness to the digit period of the interdigital electrodes is set in the range of 0.03 to 0.10, whereby the propagation loss can be made sufficiently lower than conventionally. The ratio is preferably in the range of 0.07 to 0.09, more preferably 0.08 or a value which can be regarded substantially as 0.08, whereby the propagation loss can be minimized.

Stated more specifically, the direction of propagation of the surface acoustic waves wherein the longitudinal wave component predominates over the transverse wave component, the quasi surface acoustic waves wherein the longitudinal wave component predominates over the transverse wave component or the surface skimming bulk waves wherein the longitudinal wave component predominates over the transverse wave component is (40 deg to 90 deg, 40 deg to 90 deg, 0 deg to 70 deg) as expressed in Eulerian angles and within a range equivalent thereto, whereby a higher acoustic velocity and a greater electromechanical coupling factor are available.

The expression in Eulerian angles is a known expression method of specifying a cut plane and the direction of propagation of surface acoustic waves by the combination of three angles ($\phi$, $\theta$, $\psi$). With reference to FIG. 6, suppose the crystal axes are X, Y and Z. The X-axis is rotated about the Z-axis toward the Y-axis through an angle $\phi$ to provide an A1-axis. Next, the Z-axis is rotated about the A1-axis counterclockwise through an angle $\theta$ to provide an A2-axis. The crystal is cut in a plane containing the A1-axis with the A2-axis serving as a normal to provide a substrate. With the substrate thus cut, the A1-axis is rotated about the A2-axis counterclockwise through an angle $\psi$) to provide an A3-axis which is to be the surface acoustic wave propagation direction. At this time, the cut plane and the wave propagation direction are expressed in Eulerian angles ($\phi$, $\theta$, $\psi$)).

The surface acoustic wave device embodying the invention comprises a substrate capable of exciting longitudinal wave-type surface acoustic waves, longitudinal wave-type quasi surface acoustic waves, or longitudinal wave-type surface skimming bulk waves, and interdigital electrodes formed on a surface of the substrate and having a suitable electrode digit period and a suitable film thickness. The provision of the electrodes thus designed makes it possible to minimize the propagation loss of the longitudinal wave-type surface acoustic waves, longitudinal wave-type quasi surface acoustic waves, or longitudinal wave-type quace skimming bulk waves.

DETAILED DESCRIPTION OF EMBODIMENTS

First Embodiment

This embodiment, a surface acoustic wave device, comprises a substrate prepared from lithium tantalate and adapted to excite longitudinal wave-type quasi surface acoustic waves, and interdigital electrodes of aluminum formed on the substrate.

Figure 5:
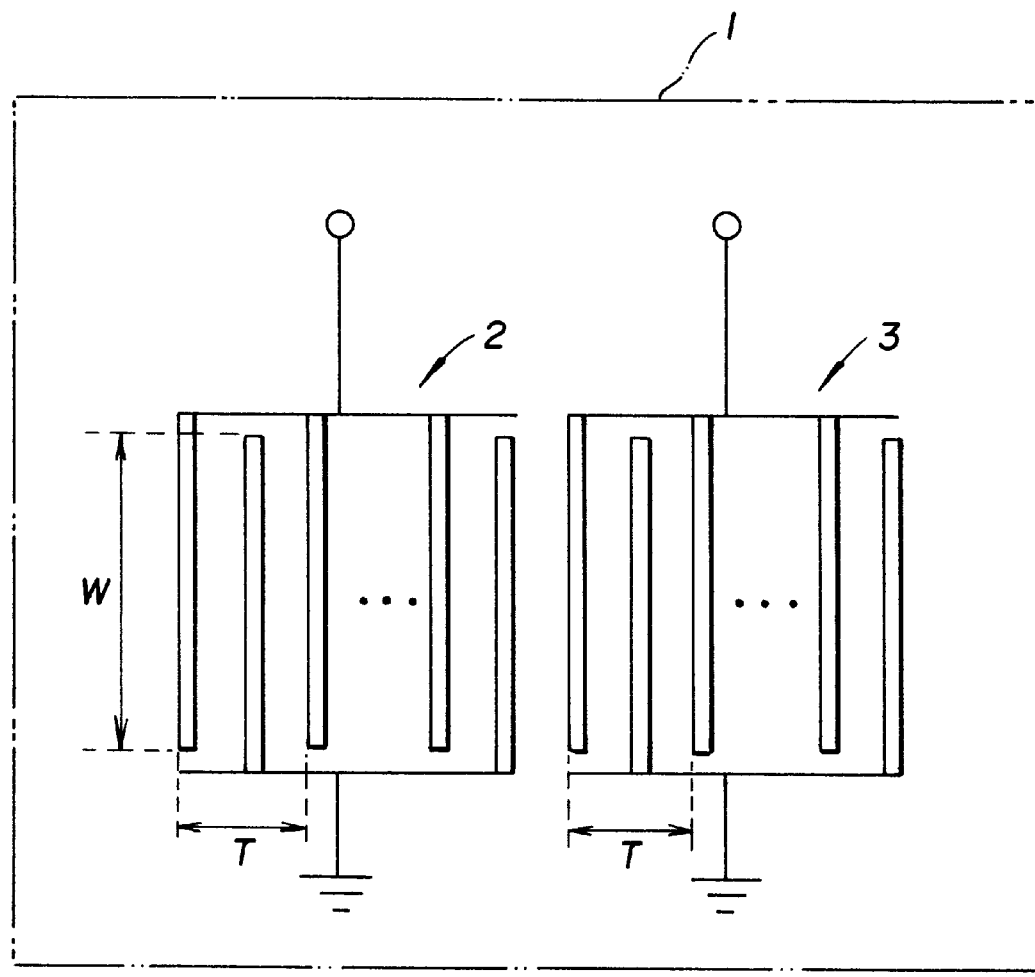
FIG. 5 is a plan view showing interdigital electrodes of a surface acoustic wave filter.
Figure 6:
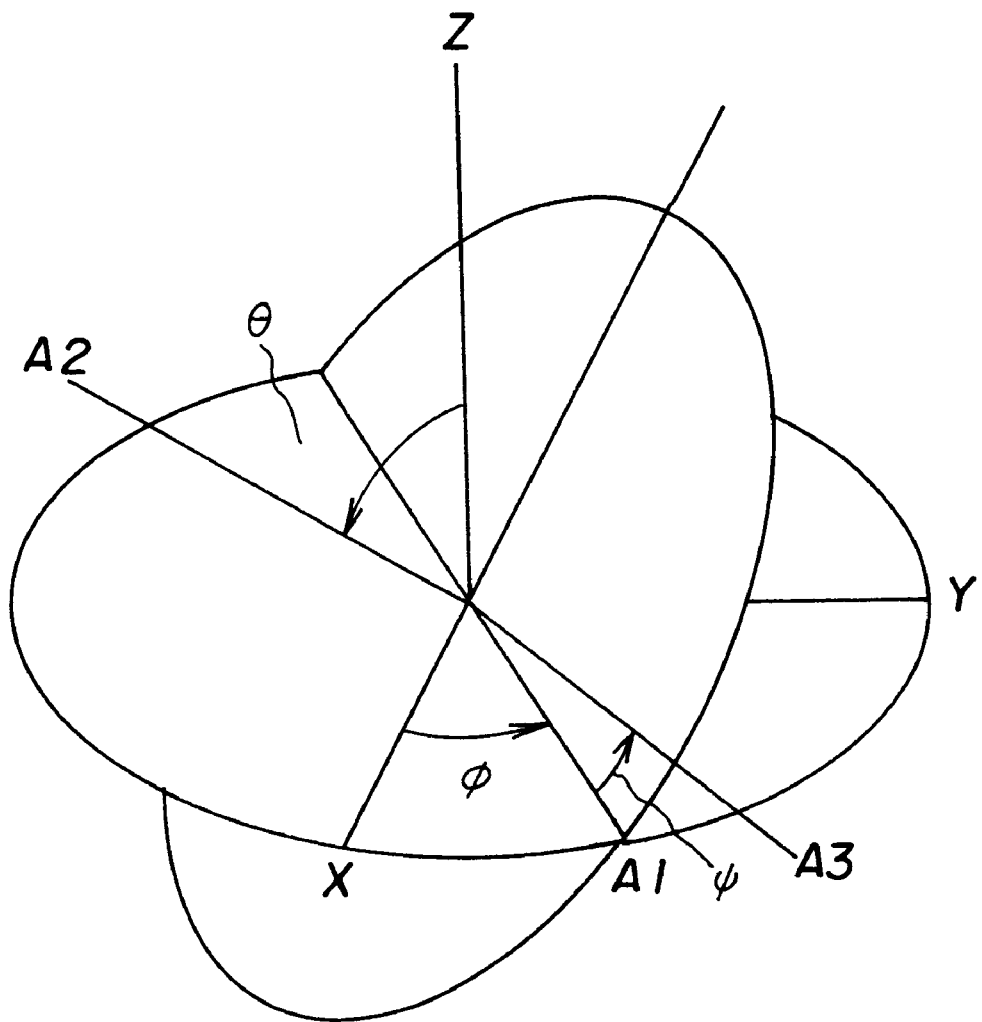
FIG. 6 is a diagram for illustrating the expression in Eulerian angles.

To clarify the requirement of electrodes for minimizing the propagation loss of the surface acoustic wave device, many samples of surface acoustic wave filters were fabricated, each of the filters comprising a substrate 1 of lithium tantalate, and an input interdigital electrode 2 and an output interdigital electrode 3 both made of aluminum thin film and formed on the substrate 1 as shown in FIG. 5. The samples were different in the thickness of the film and the digit period T of the electrodes and checked for insertion loss and acoustic velocity by a network analyzer.

The substrate 1 was 0.35 mm in thickness, and each of the interdigital electrodes 2, 3 had 100 pairs of electrode digits and was 600 micrometers in the interlocking width W of the digits.

The propagation direction determined of longitudinal wave-type quasi surface acoustic waves is (40 deg to 90 deg, 40 deg to 90 deg, 0 deg to 60 deg .), preferably (80 deg to 90 deg, 80 deg to 90 deg, 20 deg to 40 deg), more preferably (88 deg to 90 deg, 88 deg to 90 deg, 30 deg to 32 deg), most preferably (90 deg, 90 deg, 31 deg) as expressed in Eulerian angles. The superiority of these angular ranges has already been reported [see, for example, Proceedings of the 15th Symposium on Fundamentals and Applications of Ultrasonic Electronics, pp. 185–186(1994)].

Figure 1:
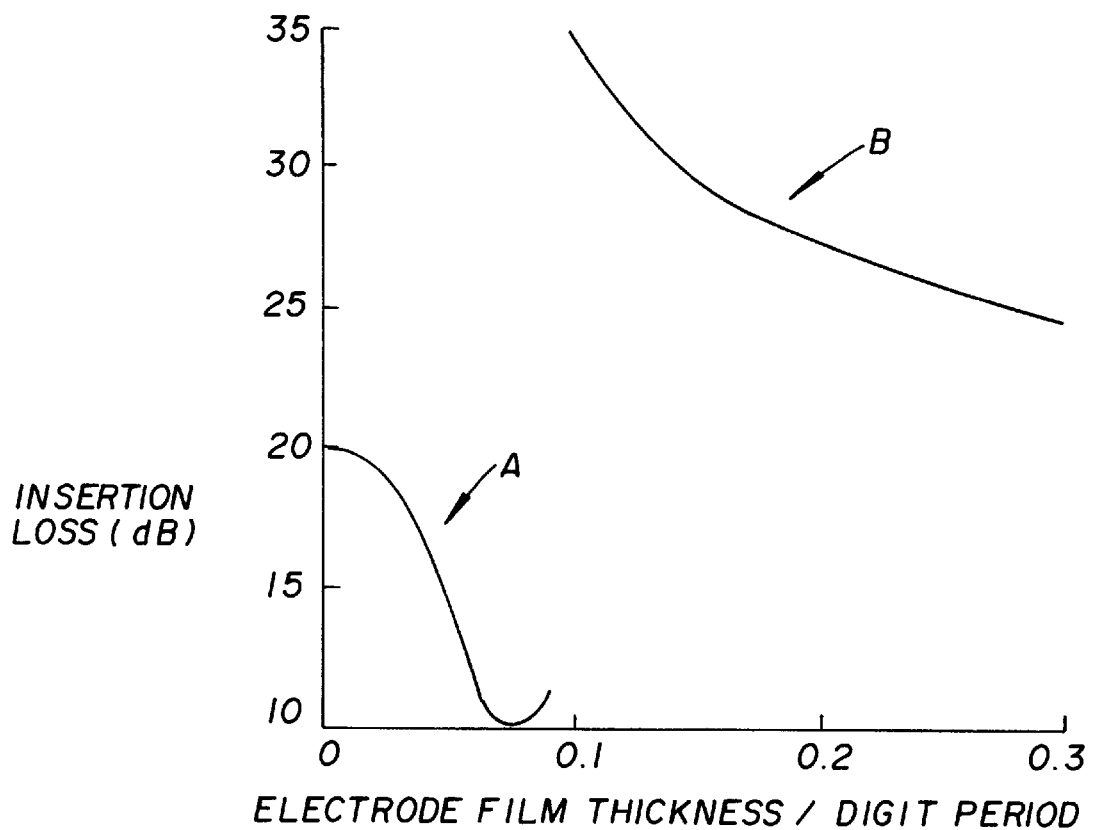
FIG. 1 is a graph showing the relationship between the insertion loss and the ratio of the film thickness to the electrode digit period of interdigital electrodes of aluminum, as established for a surface acoustic device comprising a substrate of lithium tantalate, with the electrodes formed on a surface of the substrate.

FIG. 1 is a graph which shows measurements obtained by checking the samples and in which the ratio of the film thickness to the digit period of the interdigital electrodes is plotted as abscissa, and the insertion loss as ordinate.

The graph reveals that the insertion loss gradually reduces from 20 dB as the ratio of the film thickness to the electrode digit period increases from 0, and that the reducing tendency becomes markedly pronounced at a ratio of 0.03. The insertion loss decreases below 15 dB when the ratio exceeds 0.05, diminishes to a minimum of 10 dB at a ratio of about 0.08. The insertion loss slightly increases but remains up to 12 dB when the ratio increases in the range of beyond 0.08 to about 0.10.

However, the loss abruptly increases to a value beyond 35 dB when the ratio reaches about 0.11. As the ratio increases beyond 0.11, the loss gradually reduces but is still as great as above 25 dB.

Accordingly, the ratio of the film thickness to the digit period of the electrodes should be within the range of 0.03 to 0.10, preferably within the range of 0.05 to 0.09, more preferably 0.08 or a value which can be regarded substantially as 0.08. This reduces the propagation loss to a level lower than is attained by the prior art and suitable for the actual use of the device.

As seen in FIG. 1, the curve representing the variation of the insertion loss makes an abrupt change, i.e., a separation into two curves A and B. This is attributable to the excitation of different surface acoustic waves in the interior of the electrode due to the ratio of the film thickness to the electrode digit period in excess of about 0.11, giving rise to a higher mode. The higher mode thus generated is apparent also from the result shown in FIG. 2.

Figure 2:
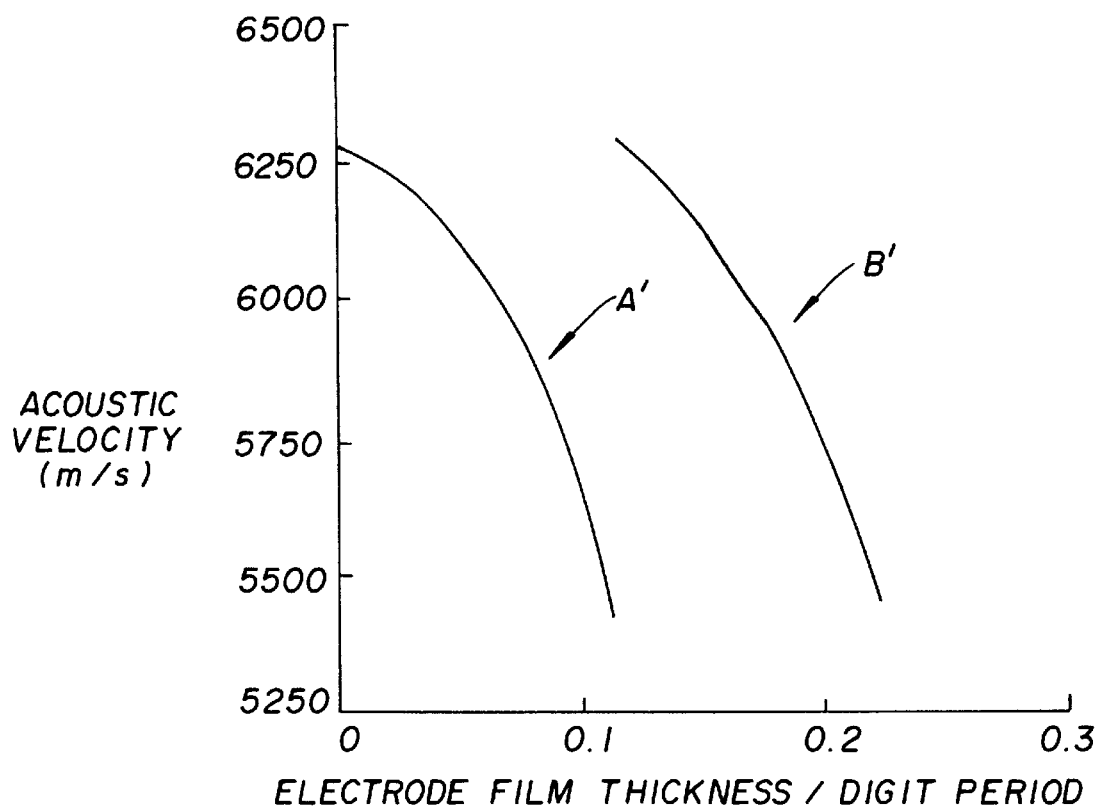
FIG. 2 is a graph showing the relationship between the acoustic velocity and the ratio of the film thickness to the digit period of the interdigital electrodes, as established for the same device.

FIG. 2 is a graph which shows measurements obtained by checking the samples and wherein the ratio of the film thickness to the digit period of the interdigital electrodes is plotted as abscissa vs. the acoustic velocity as ordinate. As illustrated, the variation of the acoustic velocity becomes discrete at a film thickness/digit period ratio of about 0.11 as represented by two apparently separate variation curves A' and B'. This result indicates that the higher mode is produced at the ratio of about 0.11.

With the surface acoustic wave device of the present invention described above, interdigital aluminum electrodes fulfilling the specified electrode requirement is formed on a lithium tantalate substrate meeting the specified substrate requirement to thereby excite quasi surface acoustic waves of the longitudinal wave type and obtain a high acoustic velocity and a great electromechanical coupling factor while ensuring a propagation loss greatly diminished from the conventional level.

Second Embodiment

This embodiment, another surface acoustic wave device, comprises a substrate prepared from lithium niobate and adapted to excite longitudinal wave-type quasi surface acoustic waves, and interdigital electrodes of aluminum formed on the substrate.

To clarify the requirement of electrodes for minimizing the propagation loss of the surface acoustic wave device, many samples of surface acoustic wave filters were fabricated as in the case of the first embodiment, each of the filters comprising a substrate 1 of lithium niobate, and an input interdigital electrode 2 and an output interdigital electrode 3 both made of aluminum thin film and formed on the substrate 1. The samples were different in the thickness of the film and the digit period T of the electrodes and checked for insertion loss and acoustic velocity by a network analyzer.

The substrate 1 was 0.35 mm in thickness, and each of the interdigital electrodes 2, 3 had 100 pairs of electrode digits and was 600 micrometers in the interlocking width W of the digits.

The propagation direction determined of longitudinal wave-type quasi surface acoustic waves is (40 deg to 90 deg, 40 deg to 90 deg, 0 deg to 70 deg .), preferably (80 deg to 90 deg, 80 deg to 90 deg, 20 deg to 50 deg), more preferably (88 deg to 90 deg, 88 deg to 90 deg, 35 deg to 40 deg), most preferably (90 deg, 90 deg, 37 deg) as expressed in Eulerian angles. The superiority of these angular ranges has already been reported [see, for example, Proceedings of the 15th Symposium on Fundamentals and Applications of Ultrasonic Electronics, pp. 185–186(1994)].

Figure 3:
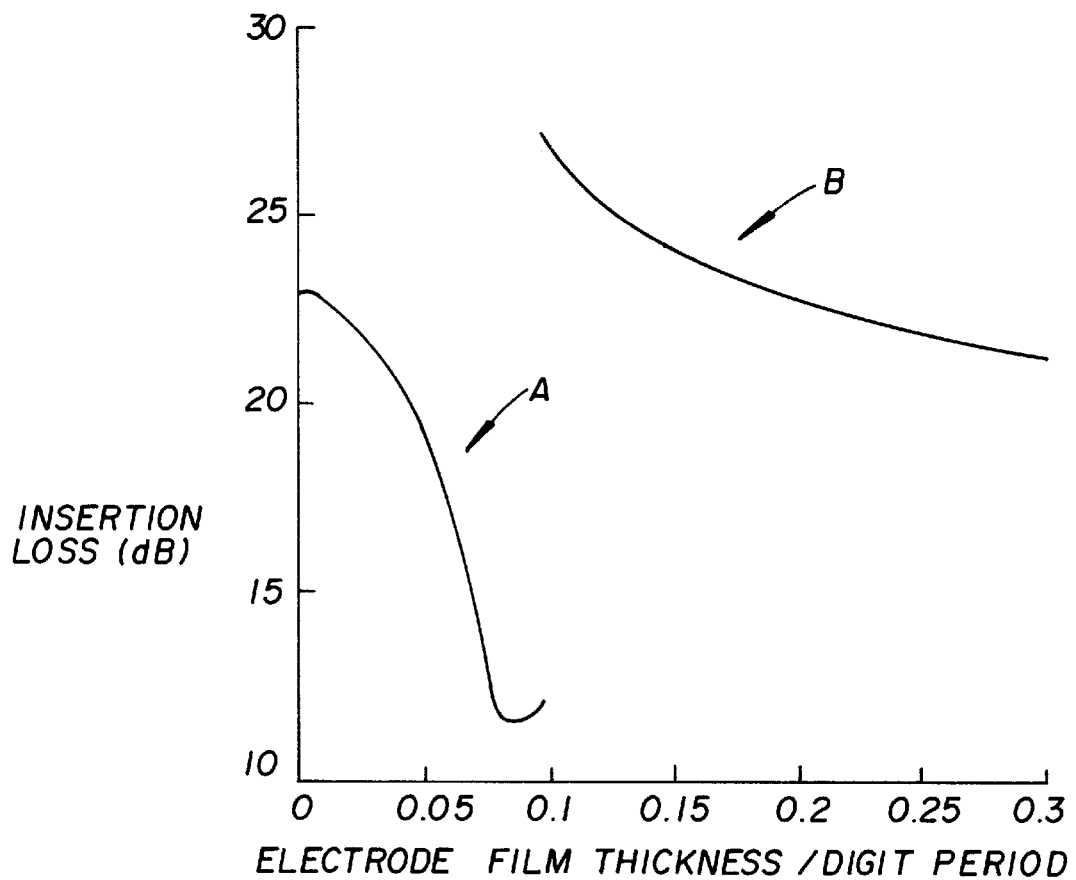
FIG. 3 is a graph showing the relationship between the insertion loss and the ratio of the film thickness to the electrode digit period of interdigital electrodes of aluminum, as established for a surface acoustic device comprising a substrate of lithium niobate, with the electrodes formed on a surface of the substrate.

FIG. 3 is a graph which shows measurements obtained by checking the samples and in which the ratio of the film thickness to the digit period of the interdigital electrodes is plotted as abscissa, and the insertion loss as ordinate.

The graph reveals that the insertion loss gradually reduces from 23 dB as the ratio of the film thickness to the electrode digit period increases from 0, and that the reducing tendency becomes markedly pronounced at a ratio of 0.03. The insertion loss decreases below 15 dB when the ratio exceeds 0.07, and diminishes to a minimum of 11.5 dB at a ratio of about 0.08. The insertion loss slightly increases but remains up to 12 dB when the ratio further increases from a value beyond 0.08 to about 0.10.

However, the loss abruptly increases to a value beyond 27 dB when the ratio increases about 0.11. As the ratio increases beyond 0.11, the loss gradually reduces but is nevertheless as great as above 21 dB.

Accordingly, the ratio of the film thickness to the digit period of the electrodes should be within the range of 0.03 to 0.10, preferably within the range of 0.07 to 0.09, more preferably 0.08 or a value which can be regarded substantially as 0.08. This reduces the propagation loss to a level lower than is attained by the prior art and suitable for the actual use of the device.

As seen in FIG. 3, the curve representing the variation of the insertion loss makes an abrupt change, i.e., a separation into two curves A and B. This is attributable to the generation of a higher mode due to the ratio of film thickness to the electrode digit period exceeding about 0.11 as is the case with the first embodiment. The higher mode thus generated is apparent also from the result shown in FIG. 4.

Figure 4:
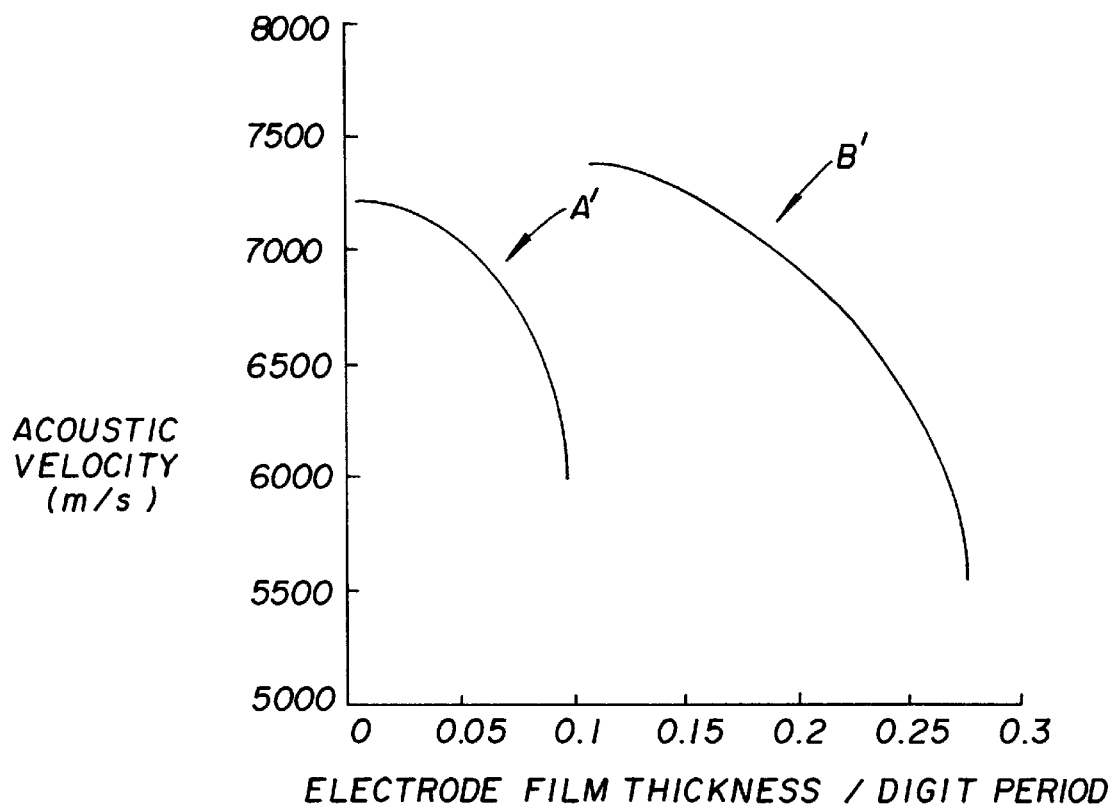
FIG. 4 is a graph showing the relationship between the acoustic velocity and the ratio of the film thickness to the digit period of the interdigital electrodes, as established for the same device.

FIG. 4 is a graph which shows measurements obtained by checking the samples and wherein the ratio of the film thickness to the digit period of the interdigital electrodes is plotted as abscissa vs. the acoustic velocity as ordinate. As illustrated, the variation of the acoustic velocity becomes discrete at a film thickness/digit period ratio of about 0.11 as represented by two apparently separate variation curves A' and B'. This result indicates that the higher mode is produced at the ratio of about 0.11.

With the surface acoustic wave device of the present invention described above, interdigital aluminum electrodes fulfilling the specified electrode requirement is formed on a lithium niobate substrate meeting the specified substrate requirement to thereby excite quasi surface acoustic waves of the longitudinal wave type and obtain a high acoustic velocity and a great electromechanical coupling factor while ensuring a propagation loss greatly diminished from the conventional level.

Besides the lithium tantalate substrate and the lithium niobate substrate, a lithium tetraborate substrate is usable as the substrate capable of exciting longitudinal wave-type surface acoustic waves. The interdigital electrodes to be formed on this substrate can be similarly optimized in the ratio of the film thickness to the electrode digit period to ensure a diminished propagation loss.

With the surface acoustic wave device comprising a lithium tetraborate substrate and an aluminum thin film formed thereon, the propagation direction determined of longitudinal quasi surface acoustic waves is in the range of (0 deg to 50 deg, 15 deg to 75 deg, 40 deg to 90 deg), preferably (0 deg to 10 deg, 40 deg to 50 deg, 80 deg to 90 deg), more preferably in the range of (0 deg to 2 deg, 44 deg to 46 deg, 88 deg to 90 deg), most preferably (0 deg, 45 deg, 90 deg) as expressed in Eulerian angles, whereby a high acoustic velocity and a great electromechanical coupling factor are available.

The embodiments described above are intended to illustrate the present invention and should not be construed as limiting the invention set forth in the appended claims or restricting the scope thereof. Furthermore, the devices of the invention are not limited to the foregoing embodiments in construction but can of course be modified variously without departing from the technical scope as set forth in the claims.

What is claimed is:

1. A surface acoustic wave device comprising a substrate capable of exciting surface acoustic waves wherein a longitudinal wave component predominates over a transverse wave component, quasi surface acoustic waves wherein a longitudinal wave component predominates over a transverse wave component, or surface skimming bulk waves wherein a longitudinal wave component predominates over a transverse wave component, and interdigital electrodes made of an electrically conductive thin film and formed on a surface of the substrate.

wherein the ratio of the thickness of the film to the period of a plurality of electrode digits connected to a common terminal are optimized, and wherein the substrate is made of lithium tantalate, and the thin film is made of an electronically conductive material including primarily aluminum, or an electrically conductive material equivalent to aluminum in specific gravity, the ratio of the film thickness to the digit period of the interdigital electrodes being set in the range of 0.03 to 0.10.

2. A surface acoustic wave device as defined in claim 1 wherein the ratio of the film thickness to the digit period of the interdigital electrodes is set in the range of 0.05 to 0.09.

3. A surface acoustic wave device as defined in claim 2 wherein the ratio of the film thickness to the digit period of the interdigital electrodes is set at 0.08 or a value which can be regarded substantially as 0.08.

4. A surface acoustic wave device as defined in claim 1 wherein the direction of propagation of the surface acoustic waves wherein the longitudinal wave component predominates over the transverse wave component, the quasi surface acoustic waves wherein the longitudinal wave component predominates over the transverse wave component or the surface skimming bulk waves wherein the longitudinal wave component predominates over the transverse wave component is (40 deg to 90 deg, 40 deg to 90 deg, 0 deg to 60 deg) as expressed in Eulerian angles and within a range equivalent thereto.

* * * * *